US007750239B2

(12) United States Patent
May

(10) Patent No.: US 7,750,239 B2
(45) Date of Patent: Jul. 6, 2010

(54) CONVENIENT AND SAFE RECEPTACLE/SWITCH AND TERMINAL BLOCK

(76) Inventor: Wing May, 186 Harding Rd., Scotch Plains, NJ (US) 07076

( * ) Notice: Subject to any disclaimer, the term of this patent is extended or adjusted under 35 U.S.C. 154(b) by 374 days.

(21) Appl. No.: 12/005,580

(22) Filed: Dec. 27, 2007

(65) Prior Publication Data

US 2009/0044963 A1 Feb. 19, 2009

Related U.S. Application Data

(60) Provisional application No. 60/965,241, filed on Aug. 17, 2007.

(51) Int. Cl.
*H05K 5/02* (2006.01)

(52) U.S. Cl. .................... 174/51; 174/40 CC; 174/135; 439/98

(58) Field of Classification Search ............. 174/40 CC, 174/51, 84 C, 135, 545; 439/92, 98, 99, 439/100, 208, 101, 102, 810
See application file for complete search history.

(56) References Cited

U.S. PATENT DOCUMENTS 6,011,218 A * 1/2000 Burek et al. ............ 174/40 CC
6,800,812 B1 * 10/2004 Franks, Jr. .................. 174/136
6,976,857 B1 * 12/2005 Shukla et al. ............... 439/100
6,986,673 B2 * 1/2006 de la Borbolla ............. 439/100
7,431,593 B2 * 10/2008 Hunter et al. ................. 439/98

* cited by examiner

*Primary Examiner*—Dhiru R Patel

(57) ABSTRACT

An electrical device for wiring an electrical appliance is provided. The electrical device includes a grounding wire having a fork and a grounding screw with the grounding wire permanently installed on the electrical device. A clamp mechanism is provided having a flexible sheet of material having a top surface, a bottom surface, a top end, and a bottom end substantially opposite the top end with the material being substantially bowed prior to insertion of the wire. An aperture is formed through the material adjacent the top end for receiving the threaded portion of a clamp screw therethrough with the screw head contactable with the to surface of the material. A pair of cutouts are adjacent the top end of the clamp mechanism with the cutouts being shaped and designed for determining the proper insertion depth of the wires beneath the material wherein upon insertion of the wire between the bottom surface of the material and the electrical device, the material substantially flattens.

19 Claims, 15 Drawing Sheets

18. Wire
61. Outlet
63. Wing Nut Terminal
64. Welding
65. Grounding wire

CONVENIENT AND SAFE RECEPTACLE/SWITCH AND TERMINAL BLOCK

The present application is a continuation of pending provisional patent application Ser. No. 60/965,241, filed on Aug. 17, 2007, entitled "Convenient and Safe Receptacle/Switch and Terminal Block".

BACKGROUND OF THE INVENTION

1. Field of the Invention

This invention relates generally to a convenient and safe receptacle/switch and terminal block and, more particularly, the invention relates to a convenient and safe receptacle/switch and terminal block having a factory equipped grounding wire, color-coded transparent insulation easily openable and closable, and a special made adjustable clamp imbedded in each terminal, including the grounding terminal.

2. Description of the Prior Art

In the past, electrical work has been very time consuming and having high error potential and risk. If a person needs to ground a receptacle or switch, they must first install the grounding wire from the power source into the grounding point of the unit, install a jumper wire from the grounding point to the metal box, and install the other jumper wire to the other units' grounding point if there are more than one unit installed into the same box. FIG. 1 illustrates the complexity of the grounding wiring two standard receptacles. FIG. 2 illustrates the complexity of wiring the grounding wires for two standard Convenient and Safe receptacles. If more than two receptacles or switches have to be installed in the same box, the first unit has the grounding wire connected to the box with the grounding screw, the second unit has the grounding wire connected to the grounding terminal of the first unit with the fork, the third unit has the grounding wire to the grounding terminal of the second unit with the fork, and so on. FIG. 3 illustrates the complexity of wiring a standard mutable outlet strip with the need for many twist on wire connectors and need for the junction box to be taller than the strip for holding the wires and the twist on wire connectors for the user to push the wires and twist on wire connectors into the junction box after wiring. Due to this complexity of installation associated with conventional electrical components, many electricians and do-it-yourselfers neglect to install a grounding wire or cover the terminals with black electrical tape creating a high potential for danger.

Of further importance, the terminals on an outlet or switch do not indicate clearly which terminal is hot, neutral, or ground, with the only reliance for the electrician is a different color screw. Thus, during a rush or during the night, a person could mistakenly install the wire in the wrong terminal.

The present invention provides each unit with a factory equipped grounding wire and color-coded transparent insulation which can be easily opened and closed. A special made clamp imbedded in each terminal is also included.

SUMMARY

The present invention is an electrical device for wiring an electrical appliance. The electrical device comprises a grounding wire having a fork and a grounding screw with the grounding wire permanently installed on the electrical device. A clamp mechanism is included comprising a flexible sheet of material having a top surface, a bottom surface, a top end, and a bottom end substantially opposite the top end with the material being substantially bowed prior to insertion of the wire. An aperture is formed through the material adjacent the top end for receiving the threaded portion of the screw therethrough with the screw head contactable with the material. At least one opening is formed through the material adjacent the top end for determining the proper insertion depth of the wires beneath the material. A pair of cutouts are formed adjacent the top end of the clamp mechanism with the cutouts being shaped and designed for determining the depth of the insertion of the wire wherein upon insertion of the wire between the bottom surface of the material and the electrical device, the material substantially flattens.

The present invention further includes a method for connecting a wire to an electrical device. The electrical device has a screw with the screw having a threaded portion and a screw head. The method comprises providing a flexible sheet of material having a top surface, a bottom surface, a top end, and a bottom end substantially opposite the top end, bowing the material, forming an aperture through the material adjacent the top end, inserting the threaded portion of the screw through the aperture, forming at least one protrusion through the material adjacent the bottom end, forming a pair of cutouts adjacent the top end of the clamp mechanism, inserting the wire between the bottom surface of the material and the electrical device, determining the proper insertion depth of the wires beneath the material through the opening, and substantially flattening the material.

Figure 15:
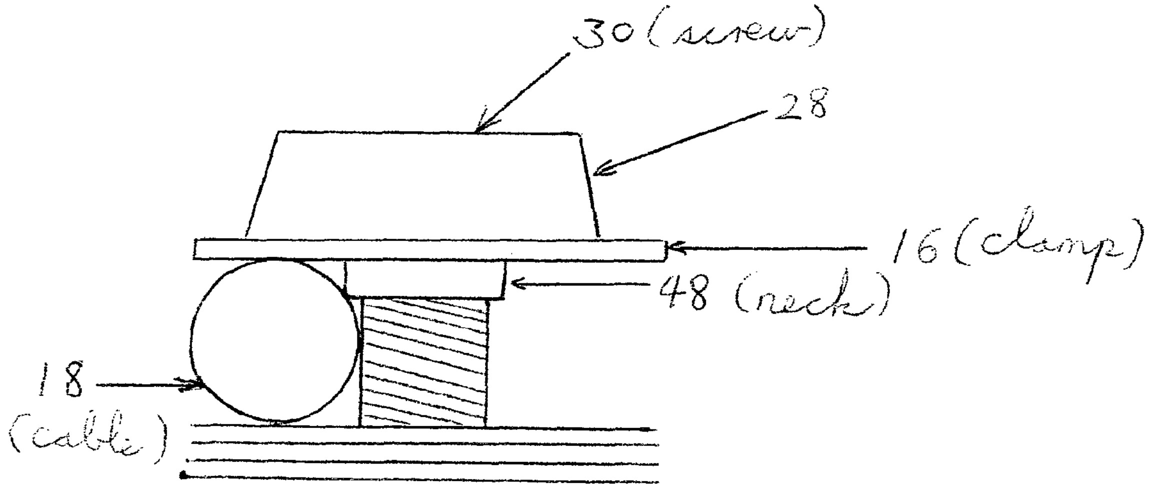
Figure 16:
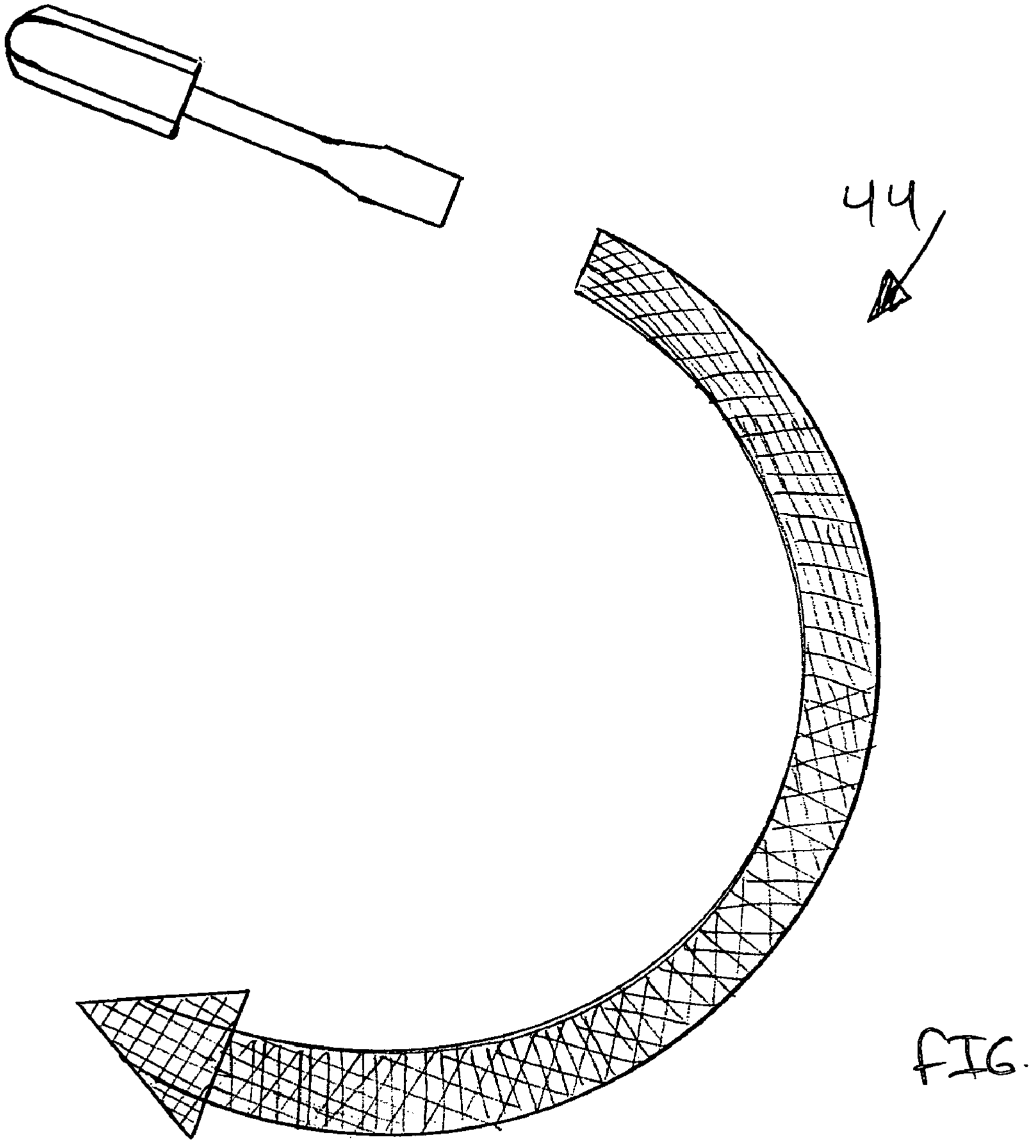

FIG. **14*a*** is a front view illustrating a grounding terminal, constructed in accordance with the present invention;

FIG. **14*b*** is a side view illustrating the grounding terminal, constructed in accordance with the present invention;

FIG. 15 is a side view illustrating a neck portion formed on the screw, constructed in accordance with the present invention; and FIG. 16 is a top view illustrating a label usable to remind electricians to tighten the screws.

DETAILED DESCRIPTION OF THE PREFERRED EMBODIMENTS

Figure 1:
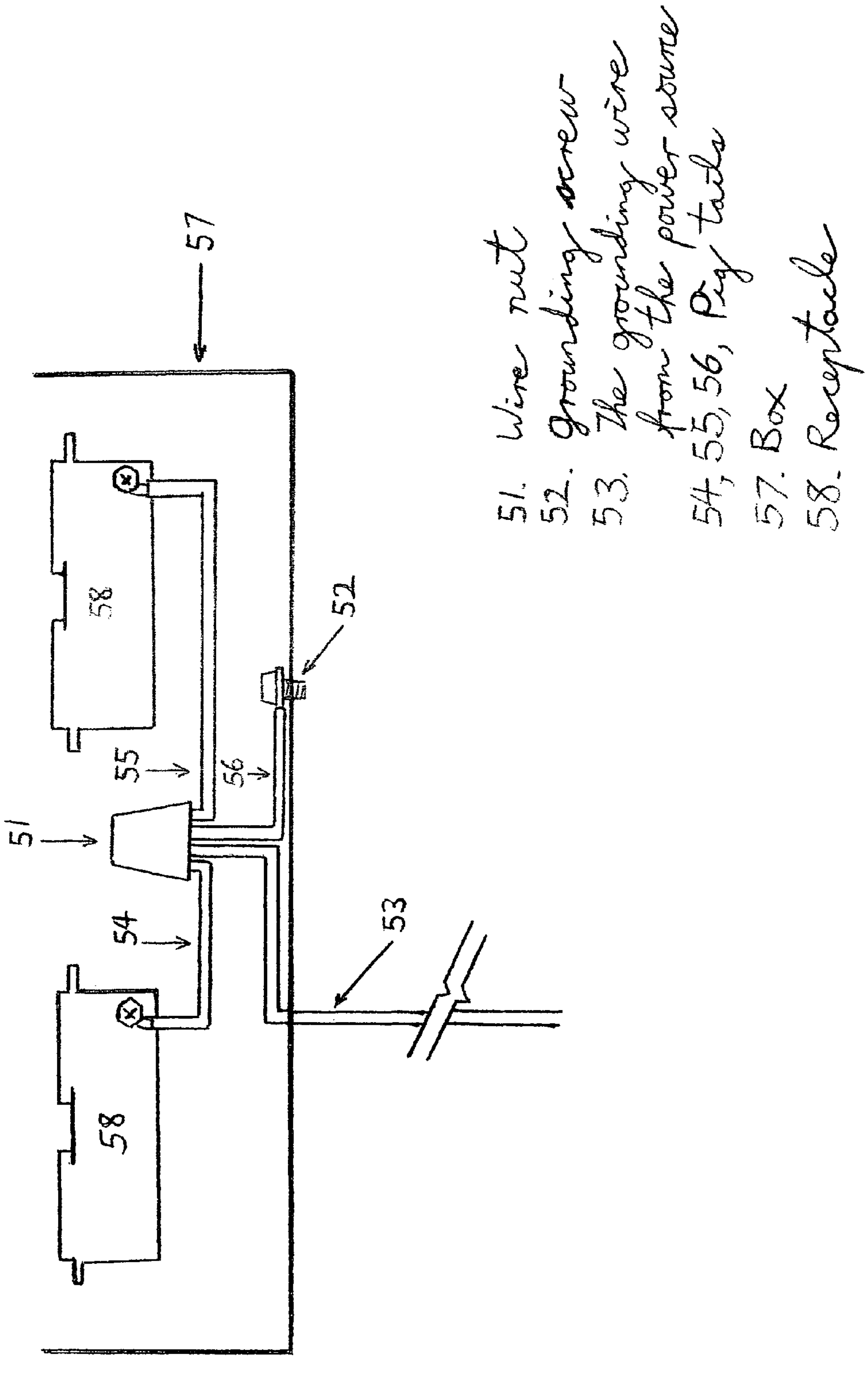
FIG. 1 is a side prior art view illustrating conventional receptacles (grounding only)
Figure 2:
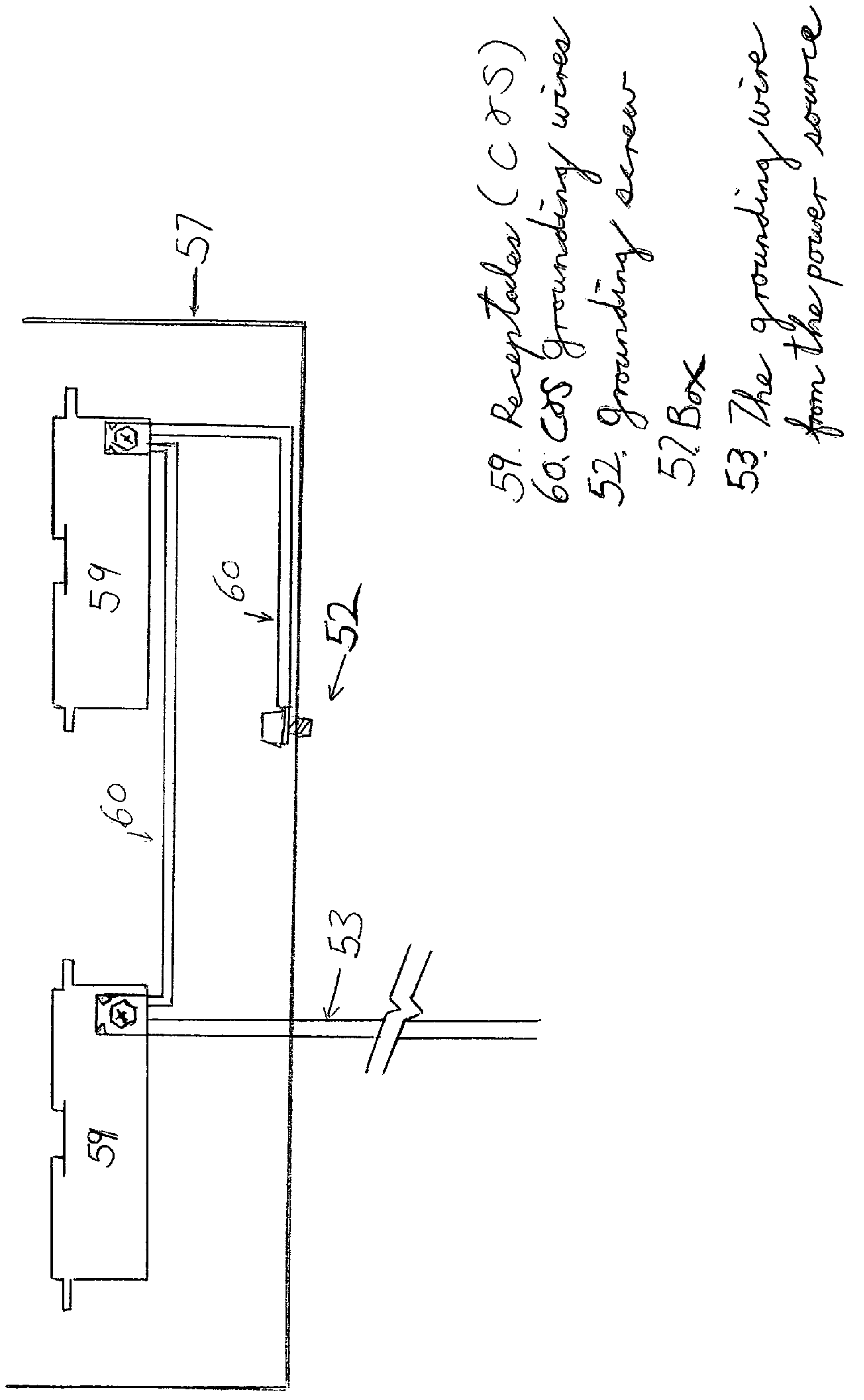
FIG. 2 is a side prior art view illustrating the Convenient and Safe Receptacles (grounding only)
Figure 3:
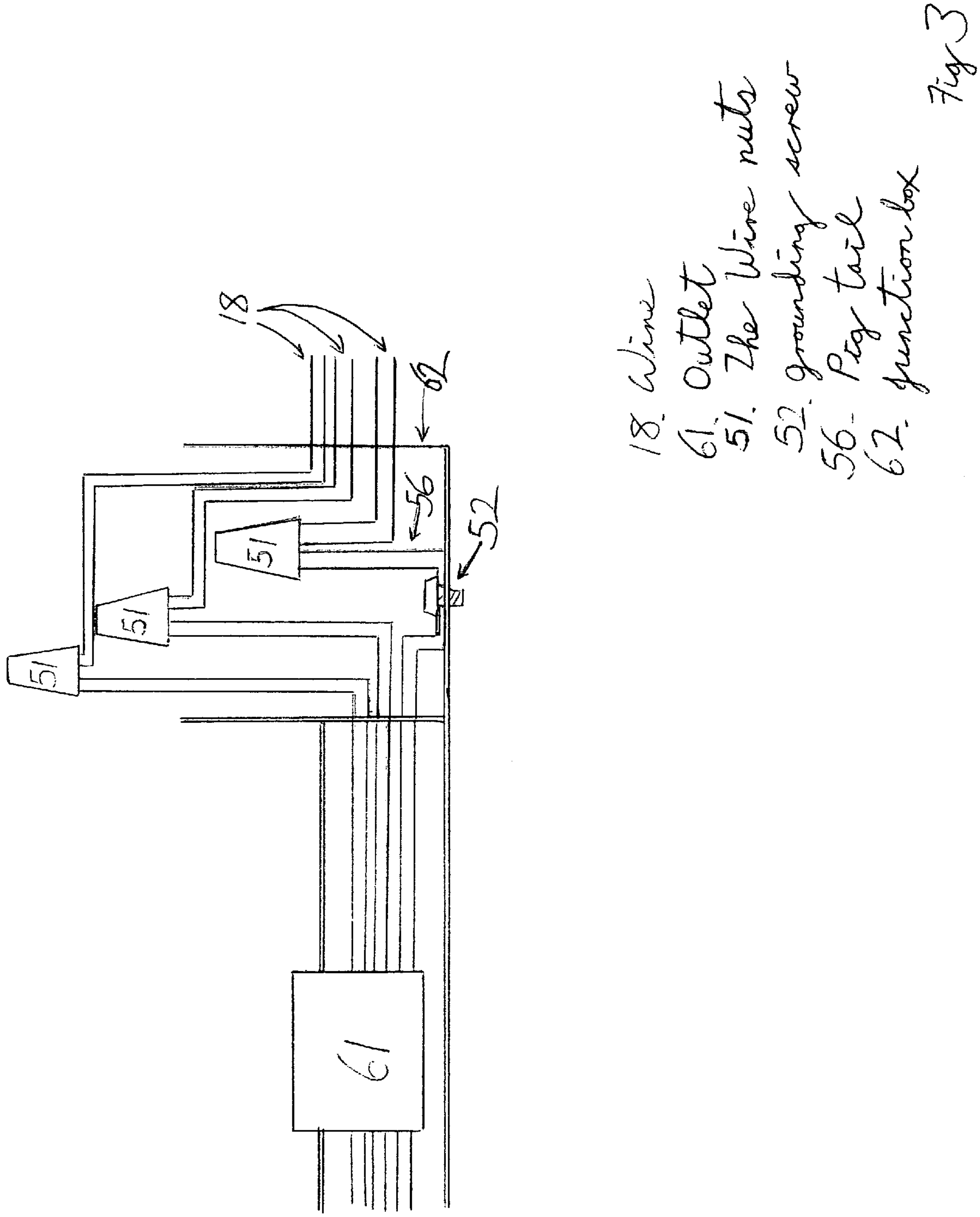
FIG. 3 is a side prior art view illustrating the wiring of a conventional mutable outlet strip.
Figure 4:
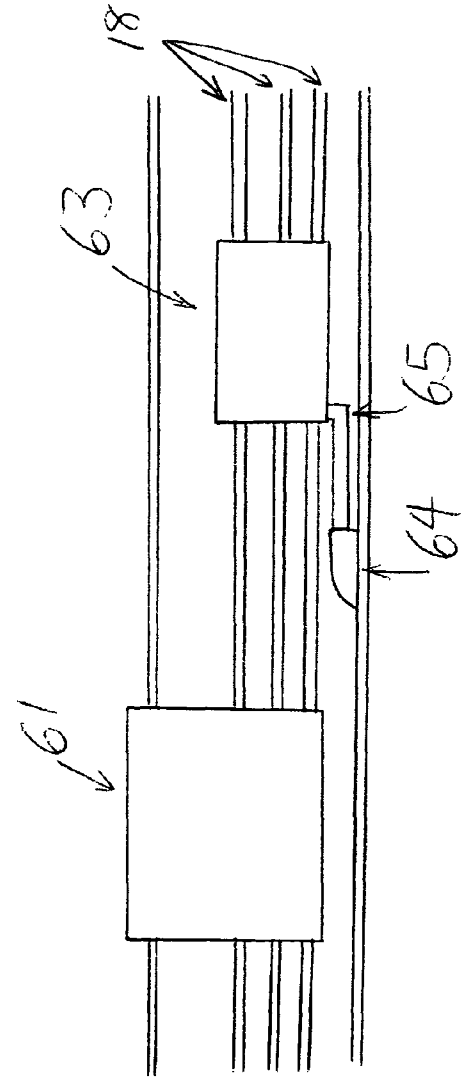
FIG. 4 is a side view illustrating a safe and convenient electrical component, constructed in accordance with the present invention, with the electrical component being easier to wire and not requiring twist on wire connectors, a junction box, or jumper wire for the grounding point since the grounding point is connected to the grounding terminal with a wire.
Figure 5:
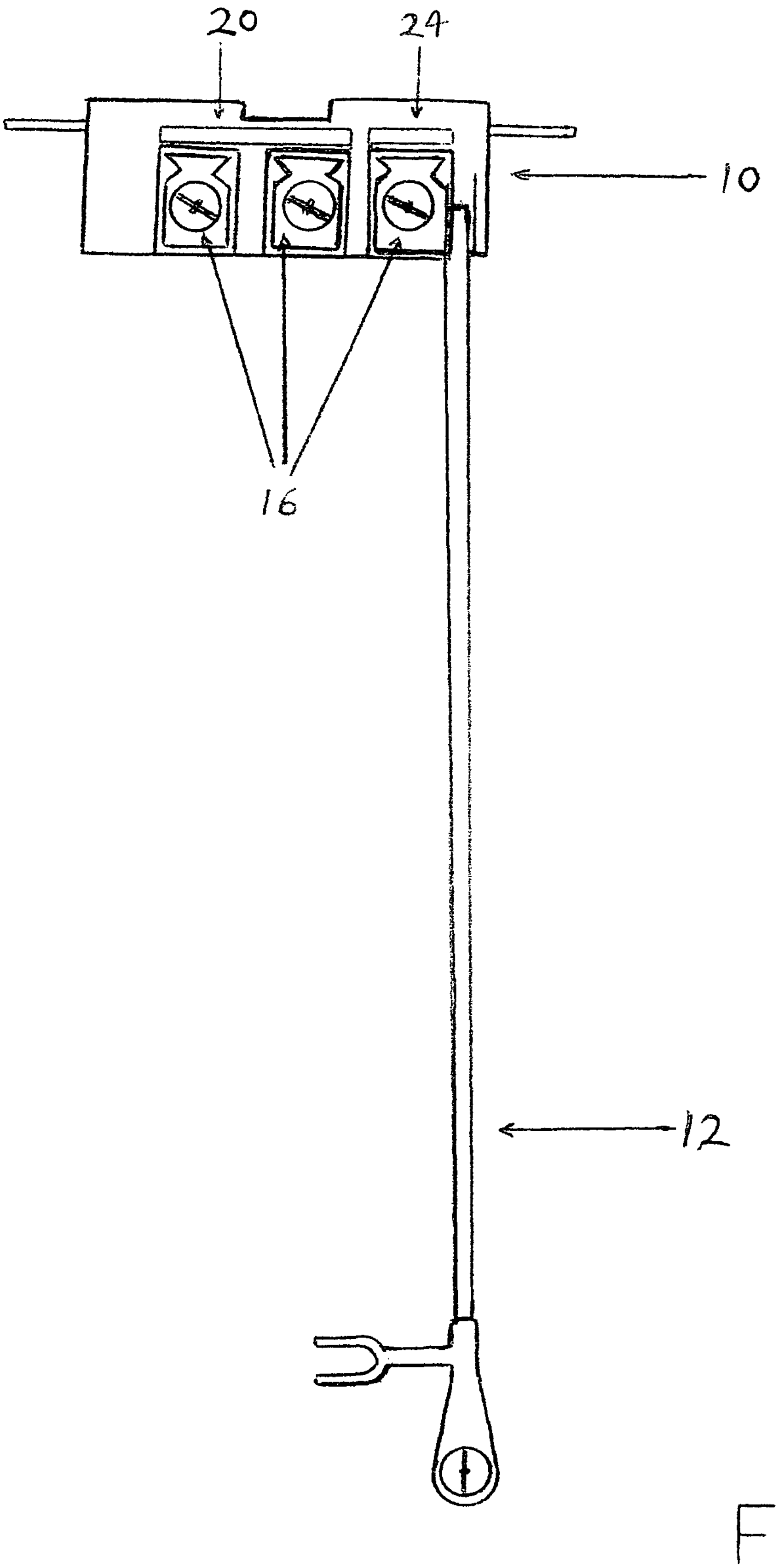
FIGS. 5-8 are perspective views illustrating a safe and convenient outlet and switch constructed in accordance with the present invention.
Figure 6:
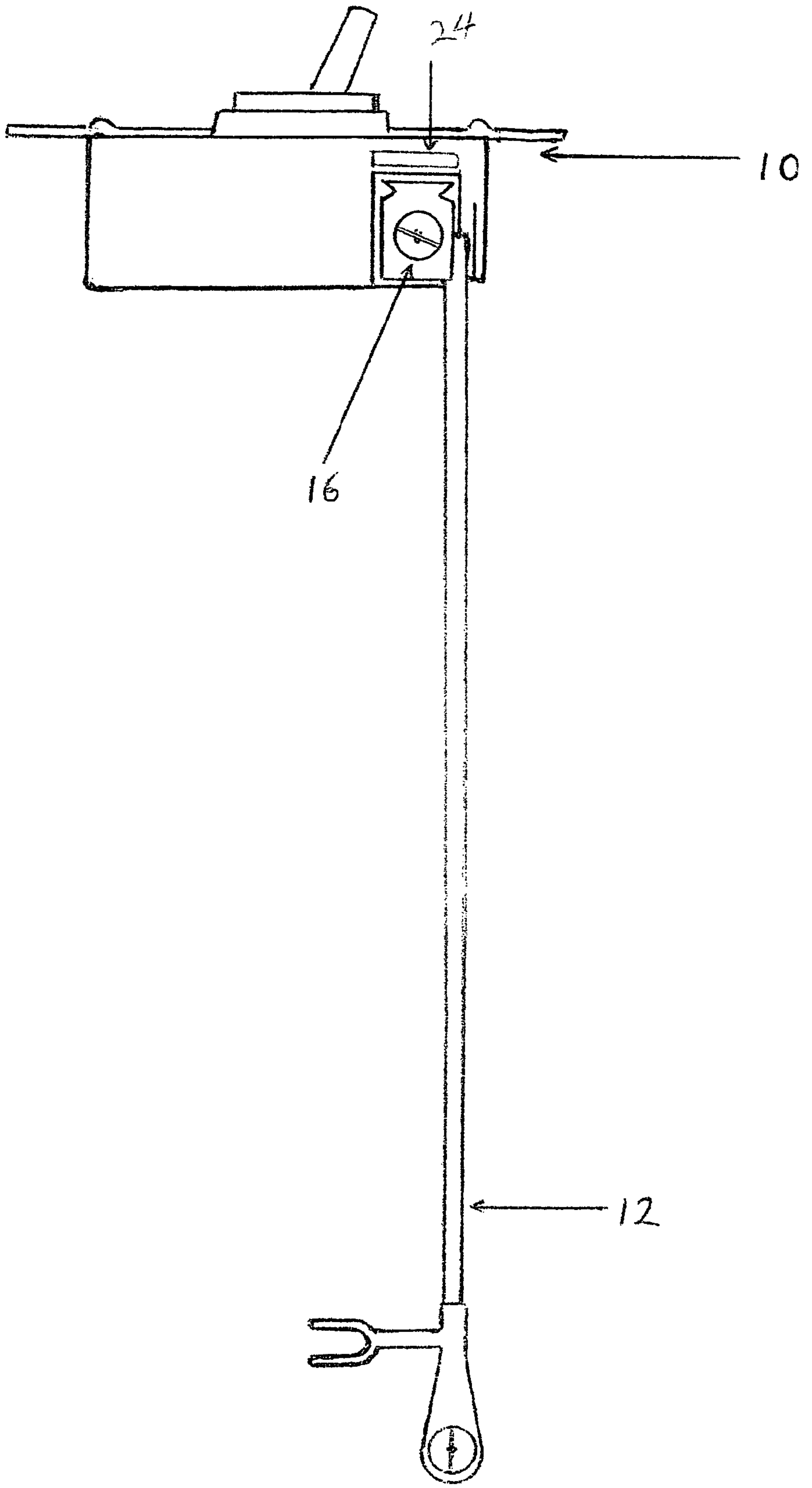
Figure 7:
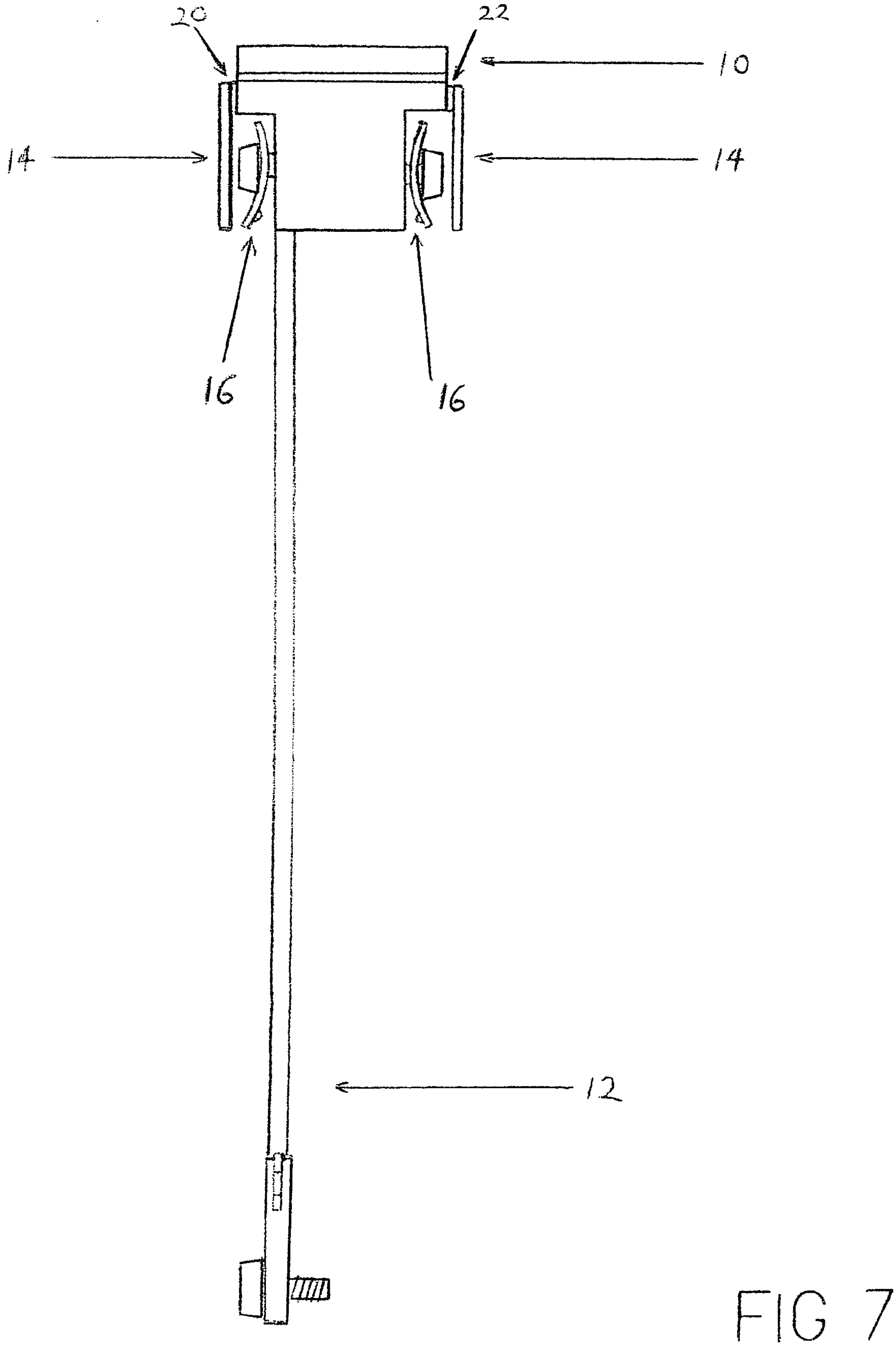
Figure 8:
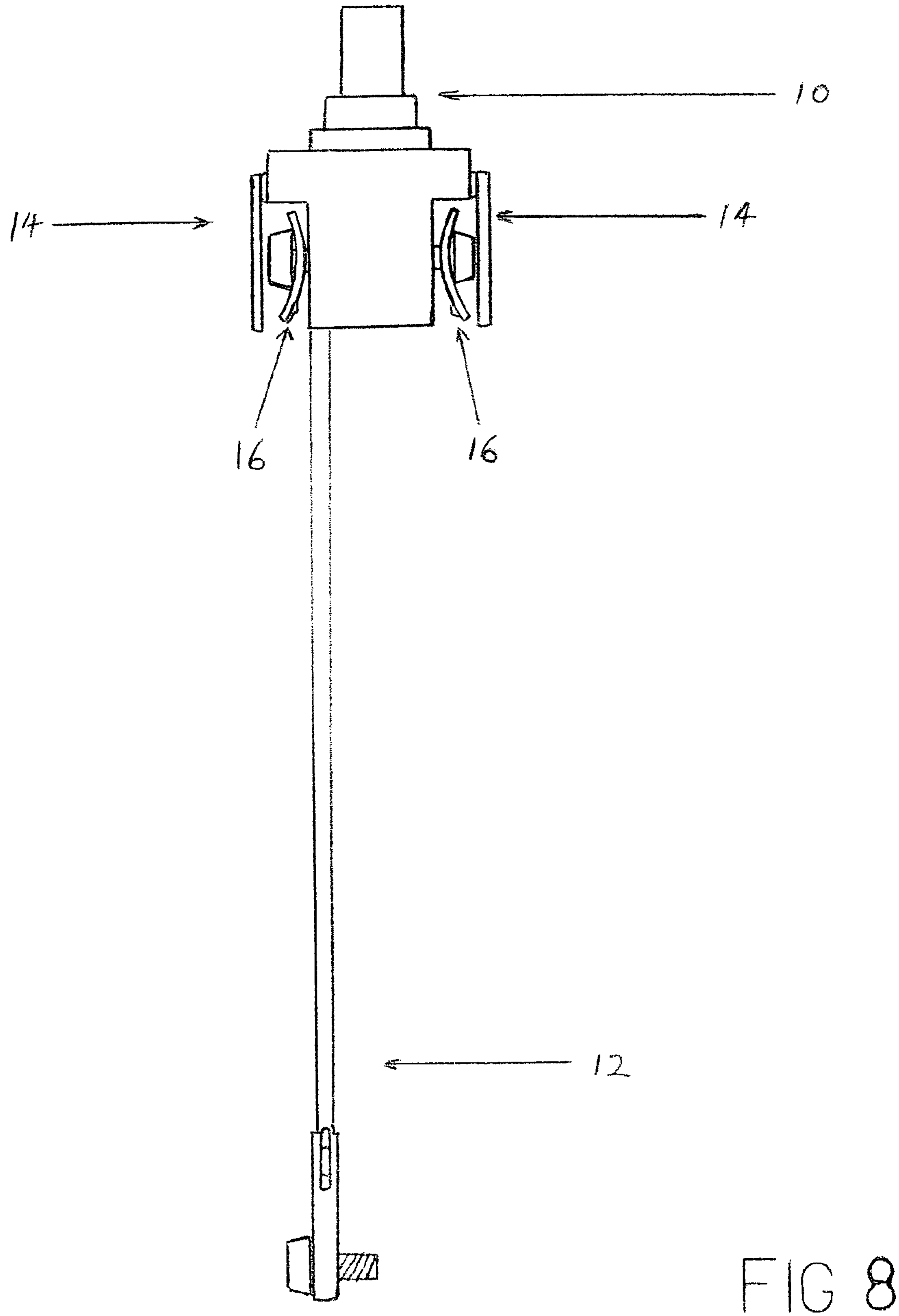
Figure 9:
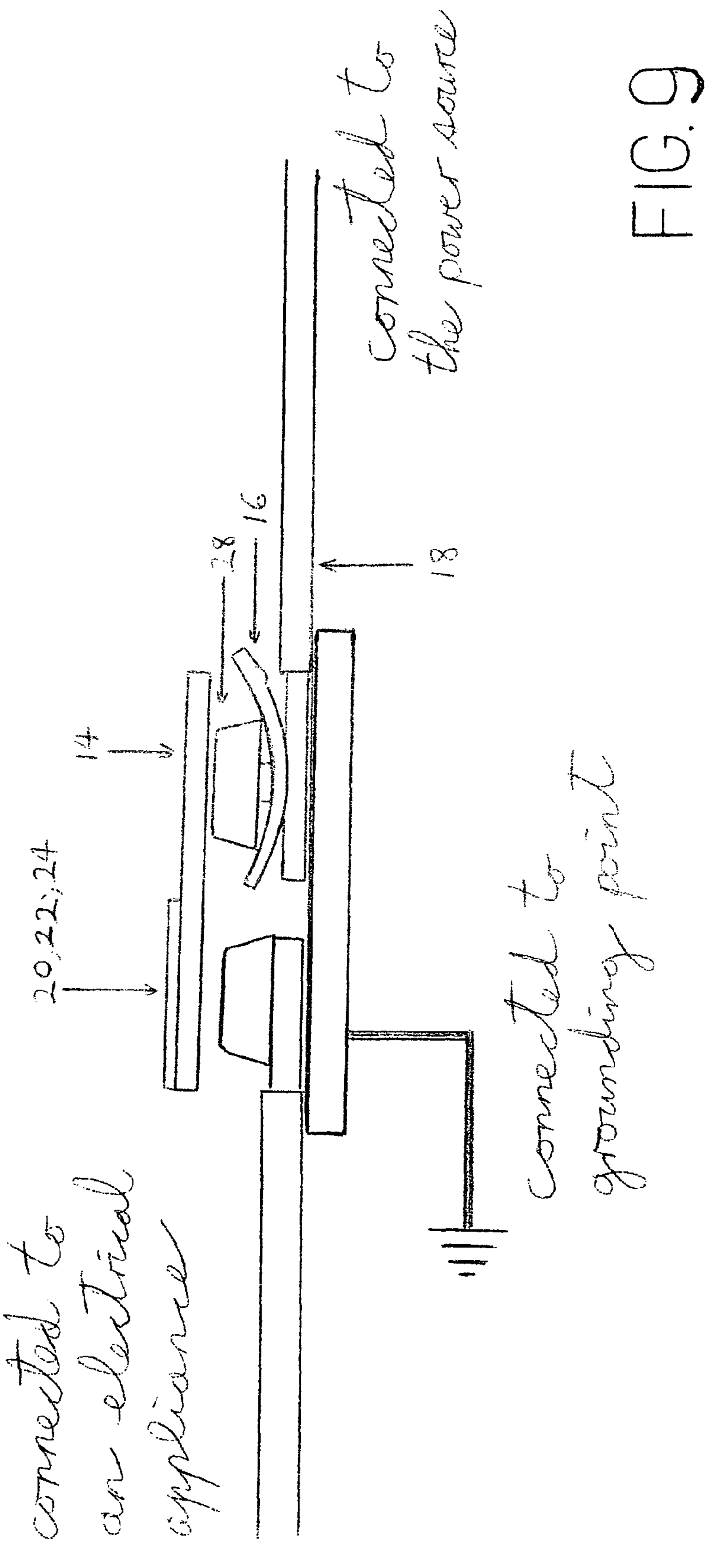
FIG. 9 is a perspective view illustrating a terminal, constructed in accordance with the present invention.
Figure 10:
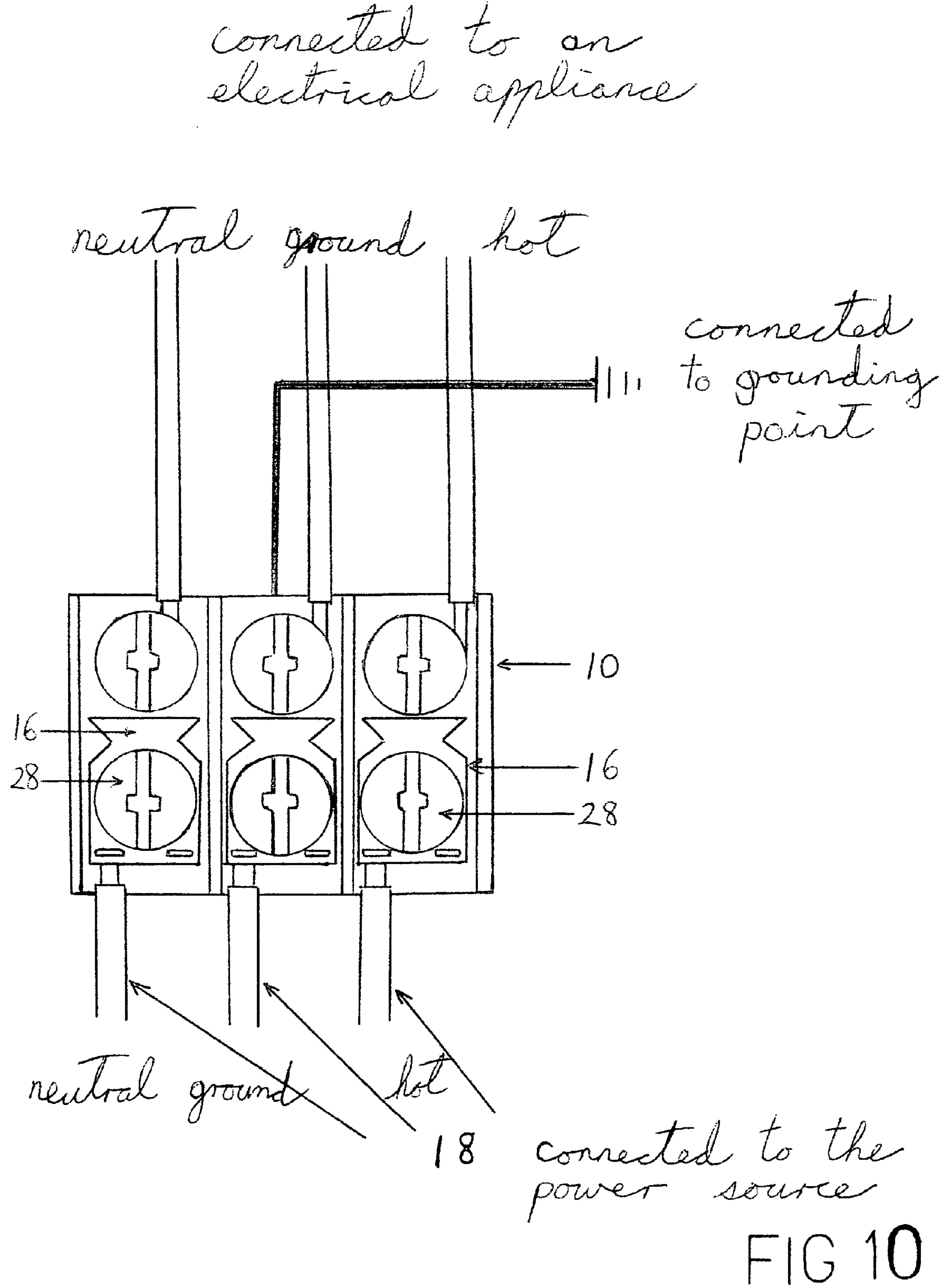
FIG. 10 is a top plan view illustrating the terminal, constructed in accordance with the present invention.

As illustrated in FIGS. 4-16, the present invention is a convenient and safe electrical device 10 such as a receptacle/ switch and terminal block. As illustrated in FIGS. 4-8, the electrical device 10 of the present invention is the convenient and safe receptacle and switch equipped with factory installed grounding wire 12 as well as transparent insulation 14 and special made clamp mechanisms 16. As illustrated in FIGS. 9 and 10, the electrical device 10 of the present invention is a terminal block with the special made clamp mechanisms 16.

Basically, the present invention is an electrical device 10 for electrical components including, but not limited to receptacles, switches, multiple outlet strips (hard wiring), light fixtures, dishwashers, and any kind of electrical appliance requiring hard wiring to install. The present invention further reduces installation mistakes and increases awareness of the mistakes when made.

The electrical device 10 of the present invention is an effective grounding system for users to connect the grounding point of the electrical component to the grounding wire from the power source. Each electrical device 10 has a grounding wire allowing two wires or one fork to be installed. Preferably, the screws for the grounding wire are color coded green. In addition, each electrical device 10 has a special made clamp 16, as will be described in further detail below. With the effective ground provided by the present invention, any electrical component having a grounding wire can connect directly to the electrical device 10 or use it as a jumper.

Figure 11:
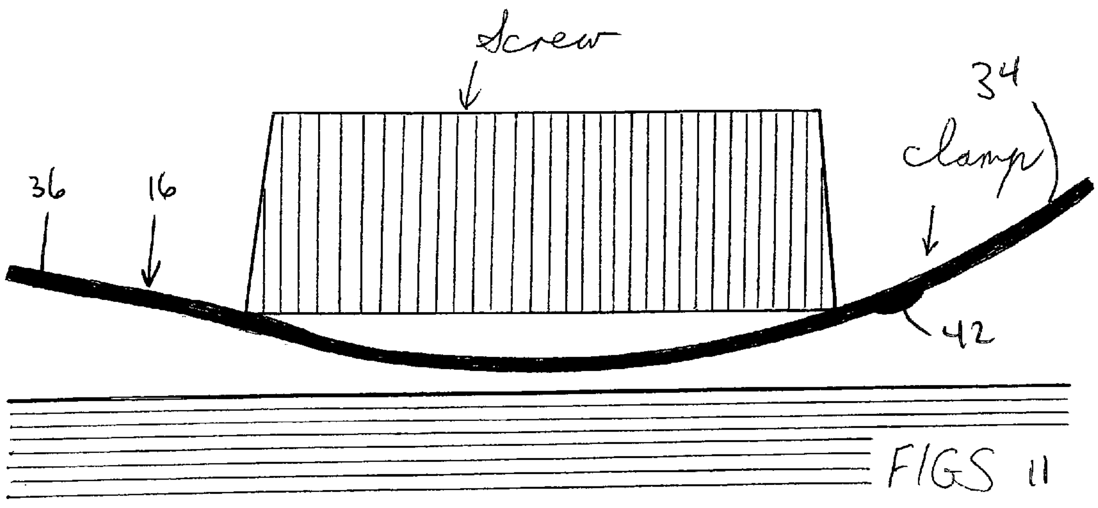
FIGS. 11 and 12 are elevational side views illustrating a clamp, constructed in accordance with the present invention.
Figure 12:
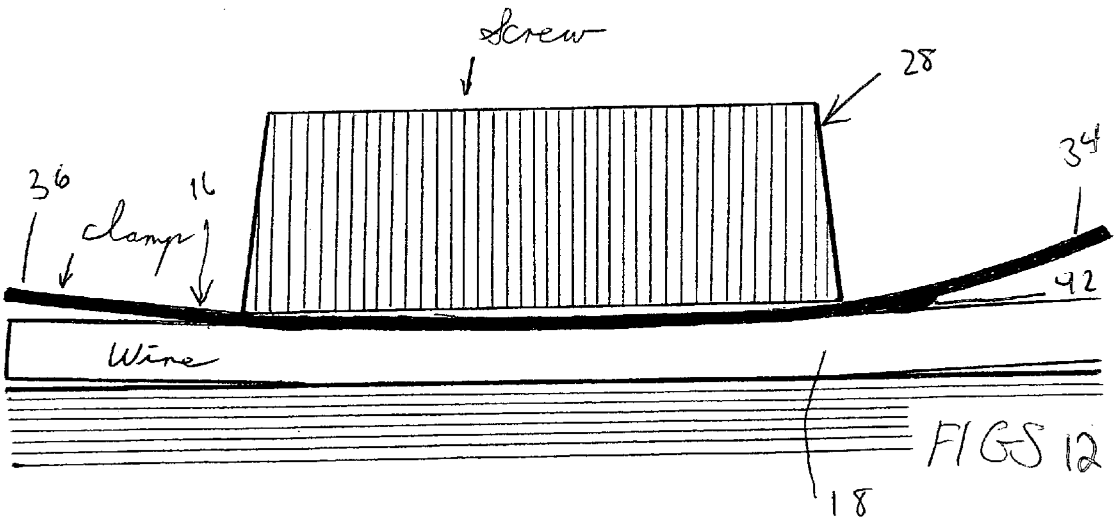
Figure 13:
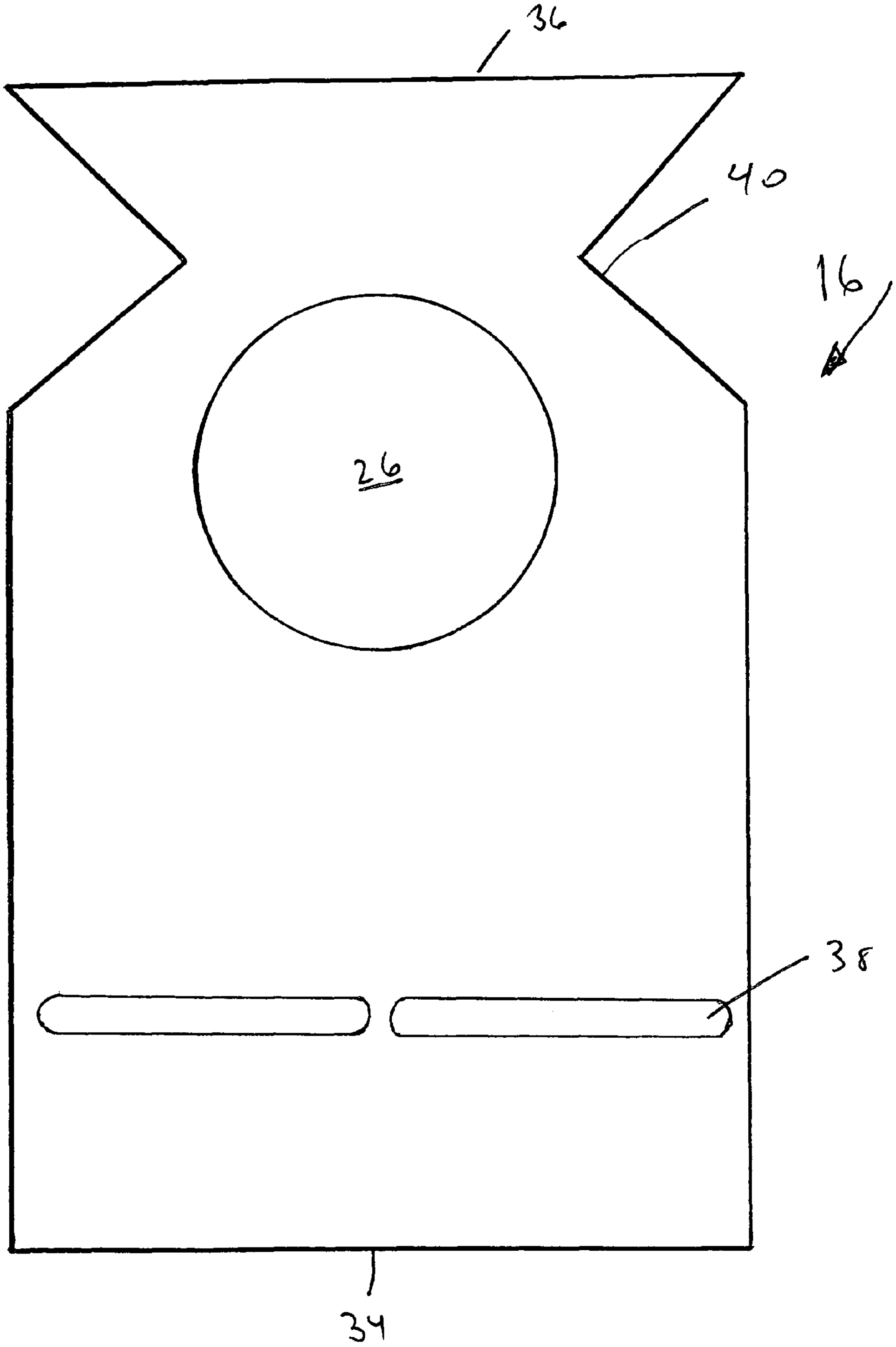
FIG. 13 is a top plan view illustrating the clamp, constructed in accordance with the present invention.

The transparent insulation 14 of the present invention is preferably pre-installed on the electrical device 10 over the terminals (not necessary for the grounding terminal). The transparent insulation 14 can be easily opened or closed and provides for increased safety (i.e., preventing a short). A fastening mechanism (not shown), such as Velcro, can be positioned on one side of the transparent insulation 14 to releasably secure the transparent insulation 14 over the terminals and the end of the wires 18. Being made of transparent material, the transparent insulation 14 allows a user to check the connection of the wires 18 to the terminals without actually having to open the insulation. Color-coded white stripes 20 on the neutral side terminal and black stripes 22 on the hot side terminal identify which terminal is the neutral terminal and which terminal is the hot terminal (see FIG. 9). A green stripe 24 can be used to identify the grounding terminal. Jumper wire 45 connects the grounding terminal to the grounding point As illustrated in FIGS. 11-13, the present invention includes the clamp mechanism 16 having an aperture 26 for receiving the terminal screw 28. The screw 28 preferably includes a screw head 30 and a threaded portion 32. The clamp mechanism 16 is positioned between the screw head 30 of the screw 28 and the electrical device 10. In addition, the clamp mechanism 16 is preferably constructed from a flexible metal material, such as brass or copper, although constructing the clamp mechanism 16 from other flexible, electrically conductive material is within the scope of the present invention.

The clamp mechanism 16 of the present invention is preferably substantially rectangular in shape having a top end 36 and a bottom end 34. In addition, the clamp mechanism 16 of the present invention has substantially triangular shaped cutouts 40 adjacent the top end 36 of the clamp mechanism 16 for determining the proper insertion depth of the wires 18 beneath the clamp mechanisms 16. In a preferred embodiment, the clamp mechanism 16 has two triangular shaped cutouts 40 for viewing the wire 18 depth on either side of the screw 28.

Furthermore, the clamp mechanism 16 of the present invention preferably has at least one protrusion 42 formed thereon and facing toward the electrical device 10. The protrusions 42 allow better connection between the wire 18 and the screw 28 and by providing additional friction for holding the wire 18 therein. The factory prepared set is an intermediate position of the screw 28, i.e., not too tight or too loose, allowing the insertion of a size number 12 or 14 wire 18 in the terminal under the clamp mechanism 16 without loosening or tightening of the screws 28.

The material clamp mechanism 16 of the present invention is preferably substantially initially bowed toward the electrical device 10, as best illustrated in FIG. 11. When the wire 18 is inserted into the clamp mechanism 16, the wire 18 forces the clamp mechanism 16 to flatten. As a result, the clamp mechanism 16 frictionally holds the wire 18 in place without adjustment of the screw 28, especially for size 12 or 14 wires 18. But, when the factory recommends the technician tighten the screws 28 for a better connection of the wire 18 therein, a small label 44 can be secured to the electrical device 10 to remind the user, as best illustrated in FIG. 16.

In addition to the bowing of the clamp mechanism 16 of the present invention, preferably the bottom end 34 of the clamp mechanism 16 has a slight tilt allowing for easier insertion of the wire 18 beneath the clamp mechanism 16. It is also possible to either loosen the screws 28 to install a bigger wire 18 or tighten the screws 28 to install a smaller wire 18 or a flock.

Furthermore, as best illustrated in FIG. 15, in order to maintain the clamp mechanism 16 in a flat position without rocking of the clamp mechanism 16 upon insertion of the wire 18, a neck portion 48 can be provided. The neck portion 48 sandwiches the clamp mechanism 16 between the neck portion and the screw head 30 such that upon insertion of the wire 18, the clamp mechanism 16 is maintained in a flat or level position upon insertion of the wire 18 under the clamp mechanism 16.

As illustrated in FIGS. 9 and 10, the terminal block version of the electrical device 10 of the present invention is presented. The terminal block preferably has three terminals. Each terminal has one side connectable to the appliance and the other side connectable to the power source. Same as the receptacle/switch, the terminals are equipped with transparent insulation 14 and the clamping mechanisms 16. The grounding terminal has a grounding wire permanently secured to the grounding point of the appliance.

Figure 14A:
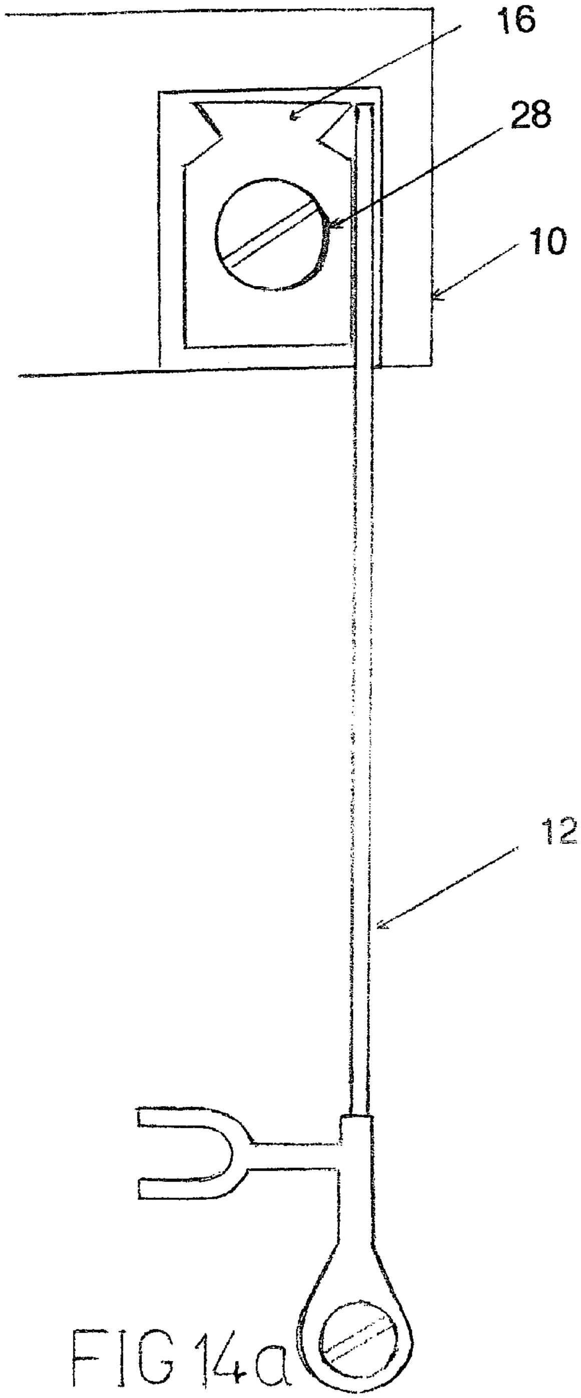
Figure 14B:
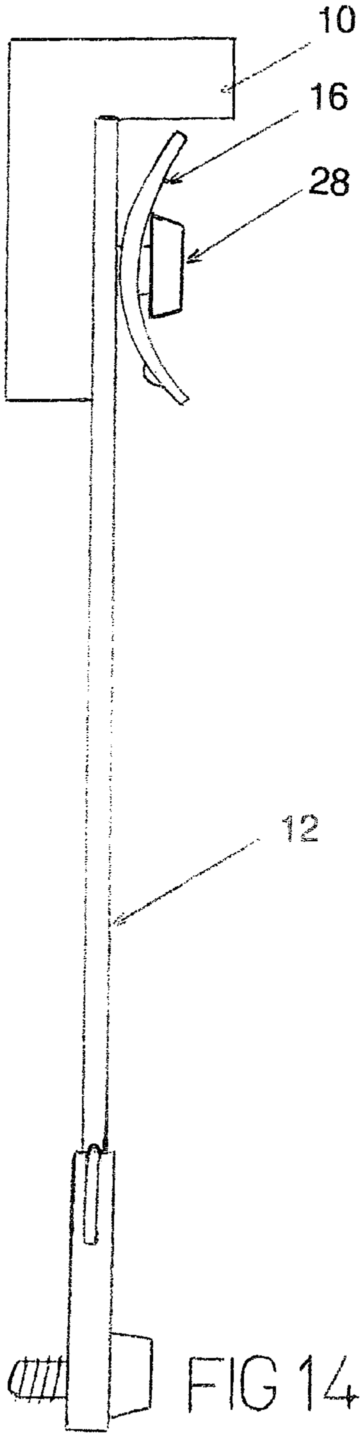

As illustrated in FIG. 14, the grounding wire and the grounding terminal is presented with the wire and the grounding terminal. The connection of the grounding wire is held in place and permanently secured, compared to the standard receptacle or switch which are hand tightened by a screw 28. The grounding wire has a grounding screw and a fork. The grounding screw is used to ground the metal box. The fork serves as a jumper to other receptacles or switches, and is designed to be installed sideways in order to save space.

The grounding terminal of the present invention further includes the clamping mechanism 16 similar to the hot and neutral terminal. The clamping mechanism 16 allows the grounding wire from the power source or the fork of the jumper to insert inside.

The present invention is preinstalled with the terminal block for reducing time consuming tedious work associated with electrical wiring. In addition, the present invention increases safety for the system by eliminating twist on wire connectors, crimped wires and the “pig tail” for grounding. Factory installed insulation and grounding systems are stronger and more efficient that current conventional grounding systems performed by local technicians since the factory can actually weld the grounding wire and provide a stronger, more efficient ground. Furthermore, the insulation of the present invention has color stripes to reduce installation mistakes.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

What is claimed is:

1. An electrical device for wiring an electrical appliance, the electrical device comprising: a grounding wire having a fork and a grounding screw with a screw head, the grounding wire permanently installed on the electrical device; a clamp mechanism comprising a flexible sheet of material having a top surface, a bottom surface, a top end, and a bottom end substantially opposite the top end, the material being substantially bowed prior to insertion of the wire; an aperture formed through the material adjacent the top end for receiving a threaded portion of a clamp screw therethrough, the screw head contactable with the surface of the material; a pair of cutouts adjacent the top end of the clamp mechanism, the cutouts being shaped and designed for determining a proper insertion depth of the wires beneath the material; wherein upon insertion of the wire between the bottom surface of the material and the electrical device, the material substantially flattens, and further comprising: a neck portion mounted to a threaded portion of the screw, the clamp mechanism sandwiched between the neck portion and the screw head.

2. The electrical device of claim 1 wherein the electrical appliance is selected from the group consisting of receptacle, switch, and terminal.

3. The electrical device of claim 1 wherein the material is positioned between the screw head and the electrical device.

4. The electrical device of claim 1 wherein the material is constructed from a flexible metal material.

5. The electrical device of claim 1 wherein the cutouts are substantially triangular shaped.

6. The electrical device of claim 1 and further comprising:

a tilt portion at the bottom end of the material, the tilt portion angling the material in a general direction toward the top surface of the material.

7. The electrical device of claim 1 and further comprising:

a strip of transparent insulation secured to the electrical device and covering the screw head and the material.

8. The electrical device of claim 7 wherein the transparent insulation is openable to expose the screw head and material and closable to cover the screw head and material.

9. The electrical device of claim 7 wherein the transparent insulation has color-coded white stripes on the neutral side and black stripes on the hot side identify which side is hot and which is neutral, and a green stripe to indicate ground.

10. The electrical device of claim 1 and further comprising:

at least one protrusion formed on the bottom surface of the material.

11. A method for connecting a wire to an electrical device, the electrical device having a screw, the screw having a threaded portion and a screw head, the method comprising:

providing a flexible sheet of material having a top surface, a bottom surface, a top end, and a bottom end substantially opposite the top end;

bowing the material;

forming an aperture through the material adjacent the bottom end;

inserting the threaded portion of the screw through the aperture;

forming a pair of cutouts adjacent the top end of a clamp mechanism;

inserting the wire between the bottom surface of the material and the electrical device;

determining a proper insertion depth of the wires beneath the material through the cutouts; and substantially flattening the material.

12. The method of claim 11 and further comprising:

constructing the material from a flexible metal material.

13. The method of claim 11 and further comprising:

forming a tilt portion at the bottom end of the material in a general direction toward the top surface of the material.

14. The method of claim 11 and further comprising:

securing a neck portion on the screw between the material and the screw head.

15. The method of claim 11 and further comprising:

securing a strip of transparent insulation to the electrical device, the transparent insulation covering the screw head and the material;

wherein the transparent insulation is openable to expose the screw head and material and closable to cover the screw head and material.

16. The method of claim 11 and further comprising:

forming at least one protrusion on the bottom surface of the material.

17. The method of claim 11 and further comprising:

providing a grounding wire having a fork and a grounding screw; and permanently installing a grounding wire on the grounding point of the electrical device.

18. An electrical device for wiring an electrical appliance, the electrical device comprising:

a grounding terminal in a receptacle or switch;

a grounding wire having a fork and a grounding screw, the grounding wire permanently installed on grounding terminals of a receptacle or the switch;

a strip of transparent insulation secured to the electrical device and covering the screw head and the material;

a clamp mechanism comprising a flexible sheet of material having a top surface, a bottom surface, a top end, and a bottom end substantially opposite the top end, the material being substantially bowed prior to insertion of the wire;

an aperture formed through the material adjacent the top end for receiving a threaded portion of a clamp screw therethrough, the screw head contactable with the to surface of the material;

at least one protrusion formed through the material adjacent the bottom end for providing better connection between the wire and the electrical device;

a pair of cutouts adjacent the top end of the clamp mechanism, the cutouts being shaped and designed for determining a proper insertion depth of the wires beneath the material; and a tilt portion at the bottom end of the material, the tilt portion angling the material in a general direction toward the top surface of the material;

wherein upon insertion of the wire between the bottom surface of the material and the electrical device, the material substantially flattens.

19. The electrical device of claim 18 wherein for other type of electrical component such as mutable outlet strip or light fixture other than receptacle and switch, a grounding wire is permanently connected to the grounding terminal to the grounding point of the component.

* * * * *